United States Patent
Brown

(10) Patent No.: US 10,249,509 B2
(45) Date of Patent: Apr. 2, 2019

(54) SUBSTRATE CLEANING METHOD AND SYSTEM USING ATMOSPHERIC PRESSURE ATOMIC OXYGEN

(71) Applicant: Tokyo Electron Limited, Tokyo (JP)

(72) Inventor: Ian J. Brown, Austin, TX (US)

(73) Assignee: Tokyo Electron Limited, Tokyo (JP)

( * ) Notice: Subject to any disclaimer, the term of this patent is extended or adjusted under 35 U.S.C. 154(b) by 1197 days.

(21) Appl. No.: 14/030,686

(22) Filed: Sep. 18, 2013

(65) Prior Publication Data

US 2014/0130825 A1 May 15, 2014

Related U.S. Application Data

(60) Provisional application No. 61/724,574, filed on Nov. 9, 2012.

(51) Int. Cl.
  *H01L 21/02* (2006.01)
  *H01L 21/311* (2006.01)

(52) U.S. Cl.
  CPC .. *H01L 21/31138* (2013.01); *H01L 21/02054* (2013.01); *H01L 21/02063* (2013.01)

(58) Field of Classification Search
  USPC ......................................................... 134/1.3
  See application file for complete search history.

(56) References Cited

U.S. PATENT DOCUMENTS

| | | |
|---|---|---|
| 4,649,273 A | 3/1987 | Chutjian et al. |
| 4,828,817 A * | 5/1989 | Outlaw .................. C01B 13/02 204/157.41 |
| 5,280,174 A | 1/1994 | Banks et al. |
| 5,332,551 A | 7/1994 | Koontz |
| 5,677,113 A | 10/1997 | Suzuki et al. |

(Continued)

FOREIGN PATENT DOCUMENTS

WO 2004001808 A2 12/2003

OTHER PUBLICATIONS

Butterbaugh, J.W. et al., FSI International Presentation at the Surface Preparation and Cleaning Conference in Austin, TX on May 4, 2006, 15 pp.

(Continued)

*Primary Examiner* — Katelyn B Whatley
(74) *Attorney, Agent, or Firm* — Wood Herron & Evans LLP

(57) ABSTRACT

Provided is a method and system for cleaning a substrate with a cleaning system comprising a pre-treatment system using an atomic oxygen generator. The substrate includes a layer to be cleaned and an underlying dielectric layer having a k-value. Pre-treatment gas comprising oxygen and an inert gas are delivered into an atomic oxygen generator, generating a process gas containing atomic oxygen. A portion of a surface of the substrate is exposed to the process gas while controlling two or more cleaning operating variables to ensure meeting two or more cleaning objectives and ensure completion of cleaning in the pre-treatment process time. In an embodiment, cleaning of the substrate in the pre-treatment process is set at less than 100 percent and a subsequent wet cleaning process is used to complete the substrate cleaning. In another embodiment, the pre-treatment system is configured to complete cleaning of the substrate.

20 Claims, 13 Drawing Sheets

(56) References Cited

U.S. PATENT DOCUMENTS

| | | | |
|---|---|---|---|
| 5,709,754 A | 1/1998 | Morinville et al. | |
| 6,143,477 A | 11/2000 | Rhieu | |
| 6,358,329 B1* | 3/2002 | Muranaka | B08B 3/08 134/26 |
| 6,503,693 B1 | 1/2003 | Mohondro et al. | |
| 6,524,936 B2 | 2/2003 | Hallock et al. | |
| 6,715,498 B1 | 4/2004 | Humayun et al. | |
| 8,268,181 B2 | 9/2012 | Srivastava et al. | |
| 2001/0017142 A1* | 8/2001 | Suzuki | B08B 3/022 134/1 |
| 2002/0151156 A1 | 10/2002 | Hallock et al. | |
| 2005/0158671 A1 | 7/2005 | Shimizu et al. | |
| 2005/0279380 A1 | 12/2005 | Elliott et al. | |
| 2005/0279453 A1 | 12/2005 | Eliott et al. | |
| 2008/0078987 A1 | 4/2008 | Leusink | |
| 2008/0160729 A1 | 7/2008 | Krueger et al. | |
| 2008/0268214 A1 | 10/2008 | Hayes et al. | |
| 2009/0293907 A1 | 12/2009 | Fung et al. | |
| 2010/0018951 A1 | 1/2010 | Christenson et al. | |
| 2010/0140756 A1 | 6/2010 | Kozasa et al. | |
| 2010/0282271 A1 | 11/2010 | Devitt | |
| 2011/0061679 A1* | 3/2011 | Elliott | B08B 7/0042 134/1.1 |
| 2011/0226280 A1 | 9/2011 | Berry et al. | |
| 2011/0259376 A1* | 10/2011 | Wagener | H01L 21/6708 134/94.1 |
| 2011/0306213 A1 | 12/2011 | Wang et al. | |
| 2012/0052687 A1 | 3/2012 | Raghavan et al. | |
| 2012/0208377 A1 | 8/2012 | Timans | |
| 2012/0247505 A1 | 10/2012 | Brown et al. | |
| 2012/0274924 A1 | 11/2012 | Delgado | |
| 2013/0233343 A1 | 9/2013 | Brown | |
| 2013/0233351 A1 | 9/2013 | Brown | |
| 2013/0330920 A1 | 12/2013 | Liu et al. | |
| 2014/0096792 A1 | 4/2014 | Brown | |
| 2014/0118751 A1* | 5/2014 | Rajagopalan | H01L 21/00 356/630 |
| 2014/0130825 A1 | 5/2014 | Brown | |

OTHER PUBLICATIONS

Govindarajan, R. et al., Effect of Pretreatment of High Dose Implanted Resists by UV Activated Hydrogen Peroxide Solutions for their Effective Removal by Conventional Sulfuric-Peroxide Mixtures, Department of Materials Science and Engineering, University of Arizona, 15 pp.

Jeong, et al., "Etching materials witn an atmospheric-pressure plasma jet", Plasma Sources Science Technology 7, (1998) pp. 282-285, IOP Publishing Limited.

Kinoshita, et al., "Stripping of high-dose ion-implanted photoresist using a combination of dry and wet single-wafer processing", ECS Journal of Solid State Science and Technology, 2(3) Q34-Q39 (2013).

* cited by examiner

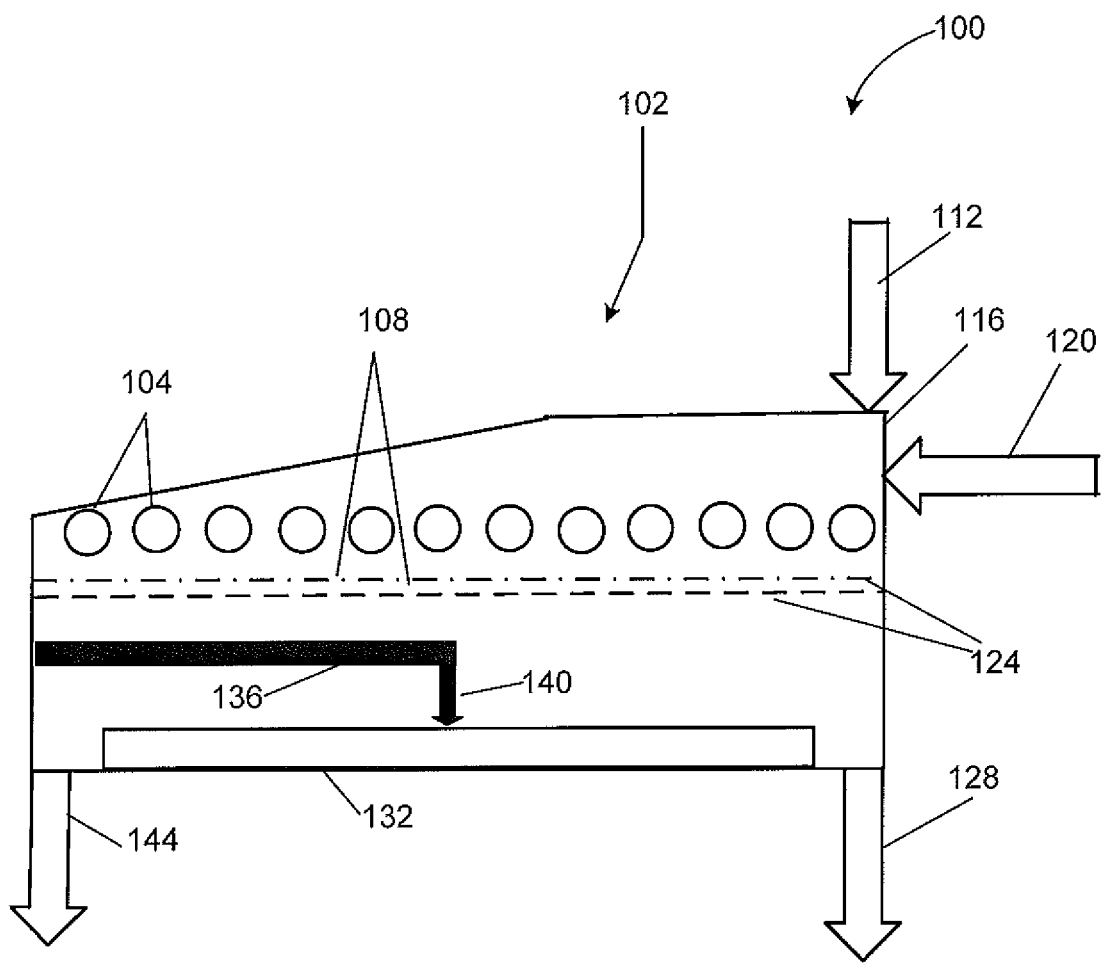
FIG. 1C *Prior Art*

SUBSTRATE CLEANING METHOD AND SYSTEM USING ATMOSPHERIC PRESSURE ATOMIC OXYGEN

Pursuant to 37 C.F.R. § 1.78(a)(4), this application claims the benefit of and priority to prior filed co-pending Provisional Application Ser. No. 61/724,574 entitled "SUBSTRATE CLEANING METHOD USING ATOMIC OXYGEN", filed on Nov. 9, 2012, which is expressly incorporated herein by reference.

FIELD

The present application generally relates to semiconductor processing and specifically to a substrate cleaning process comprising a pre-treatment process using atomic oxygen.

RELATED ART

Highly fluorinated polymers are created in reaction ion etch (RIE) patterning processes for low-k dielectrics where k-value is within the range of 2.0-2.6. Ultra-violet (UV) pre-treatment has been demonstrated to improve the polymer removal ability of typical back-end-of line (BEOL) post etch processing using compatible cleaning solvents. UV irradiation in the presence of oxygen has been used for an effective pre-treatment process prior to a wet clean process. Partial pressures of oxygen with low pressure ranges have been shown as an effective approach. However, use of UV radiation can damage the underlying low-k dielectric or cause an undesirable increase in the k-value of the film after processing.

In addition, current art cleaning systems use excimer lamps, for example, one excimer lamp directing the light less than 190 nm into the oxygen gas causing generation of ozone and another excimer lamp directing light into the ozone gas, causing generation of an oxygen radical having a high absorption coefficient. Gas including the oxygen radical is passed along the surface of the substrate to cause degeneration of the organic material thereon. Other approaches use lasers that can be generated by an excimer laser which provides UV energy for driving an oxidation reaction to decompose the resist or organic materials into byproducts such as CO, $CO_2$, and $H_2O$ that are continuously exhausted by an exhaust pump. Other dry etching techniques can also be used to clean the substrate but such techniques are typically followed with a wet clean process. The use of excimer lamps, lasers or the use of thermal ozone process generation requires the use of expensive equipment and processes. Use of UV irradiation or lasers in some pre-treatment processes can result in damage to the substrate and/or increase of the k-value of the underlying dielectric layer that affects the usability or yield of the substrate.

Periodic maintenance is required because UV light intensity deteriorates over time, adding to the cost of ownership. There is a need to clean the post etch polymer without using UV light while controlling the change of k-value or damage to the underlying dielectric film in a front-end-of-line (FEOL) or back-end-of-line (BEOL) process. In addition, there are needs for (a) reduced cost of ownership for a pre-treatment process followed by wet clean process, and (b) a simplified hardware system that reduces the number and complexity of delivery systems for process gases and treatment fluids.

SUMMARY

Provided is a method and system for cleaning a substrate with a cleaning system comprising a pre-treatment system using an atomic oxygen generator. The substrate includes a layer to be cleaned and an underlying dielectric layer having a k-value. Pre-treatment gas comprising oxygen and an inert gas are delivered into an atomic oxygen generator, generating a process gas containing atomic oxygen. A portion of a surface of the substrate is exposed to the process gas while controlling two or more cleaning operating variables to ensure meeting two or more cleaning objectives and ensure completion of cleaning in the pre-treatment process time. In an embodiment, cleaning of the substrate in the pre-treatment process is set at less than 100 percent and a subsequent wet cleaning process is used to complete the substrate cleaning. In another embodiment, the pre-treatment system is configured to complete the cleaning of the substrate.

LIST OF FIGURES

FIG. 1C is an architectural diagram illustrating a prior art system of cleaning using a UV source with two major wavelength ranges.

Figure 3A:
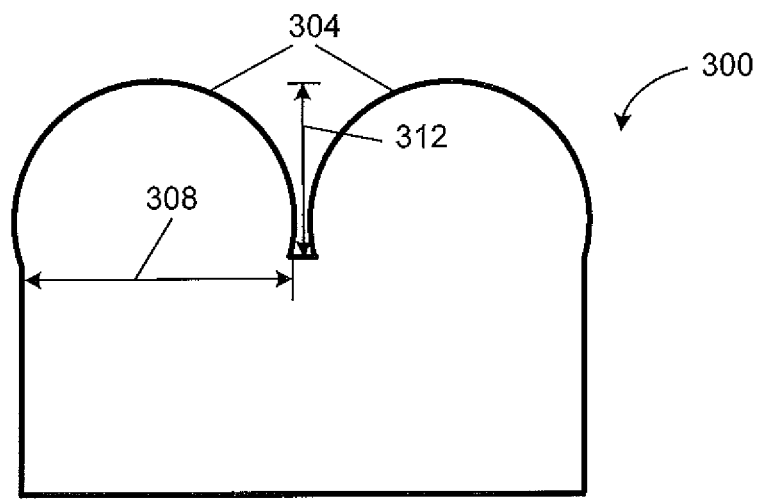
Figure 3B:
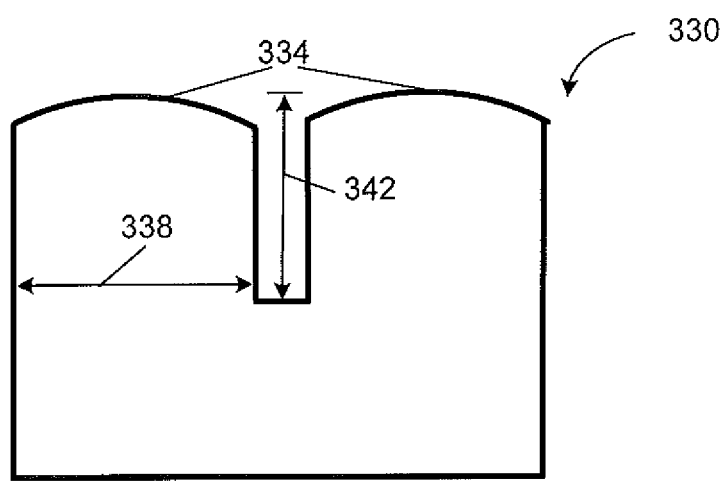
Figure 3C:
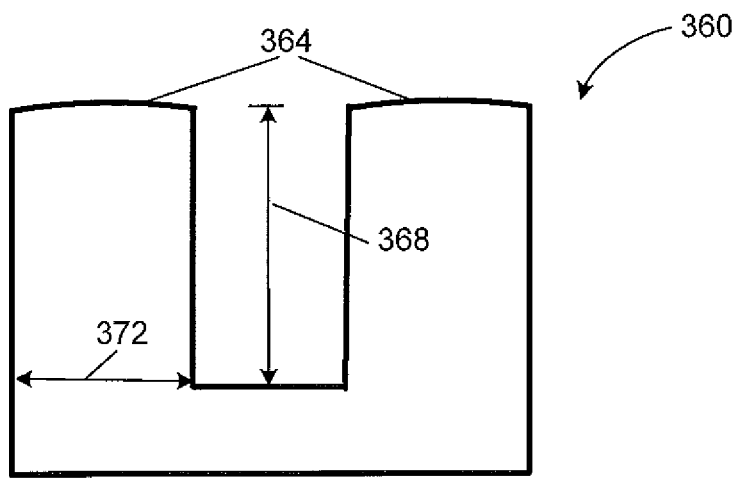

FIG. 3A depicts an exemplary side-view image of a substrate before the irradiation of the substrate with oxygen. FIG. 3B depicts an exemplary side-view image of the substrate after the pre-treatment process. FIG. 3C is an exemplary side-view image of the substrate after the pre-treatment process and a wet cleaning process.

Figure 4:
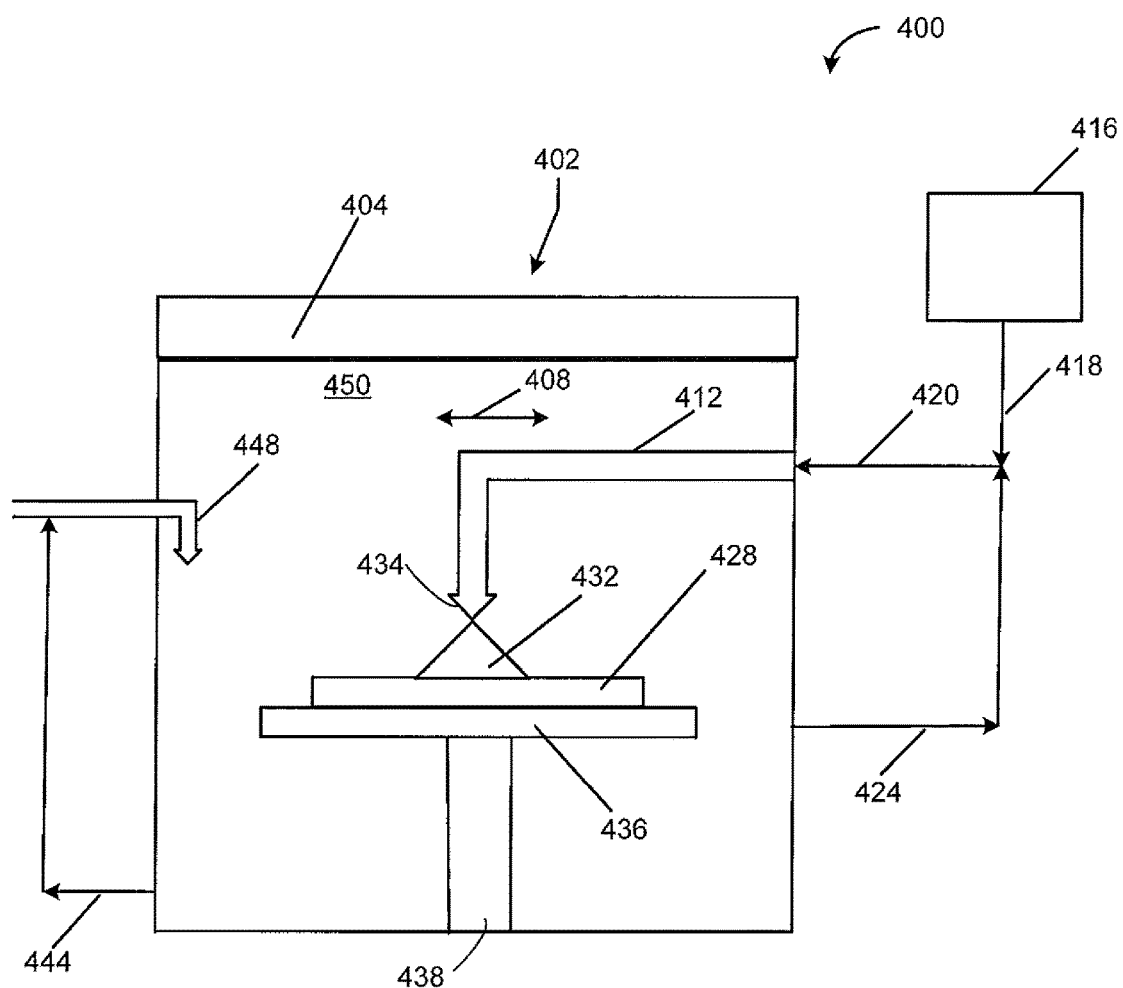

FIG. 4 is an exemplary diagram for a cleaning system using an atomic oxygen generator in an embodiment of the present invention.

Figure 5:
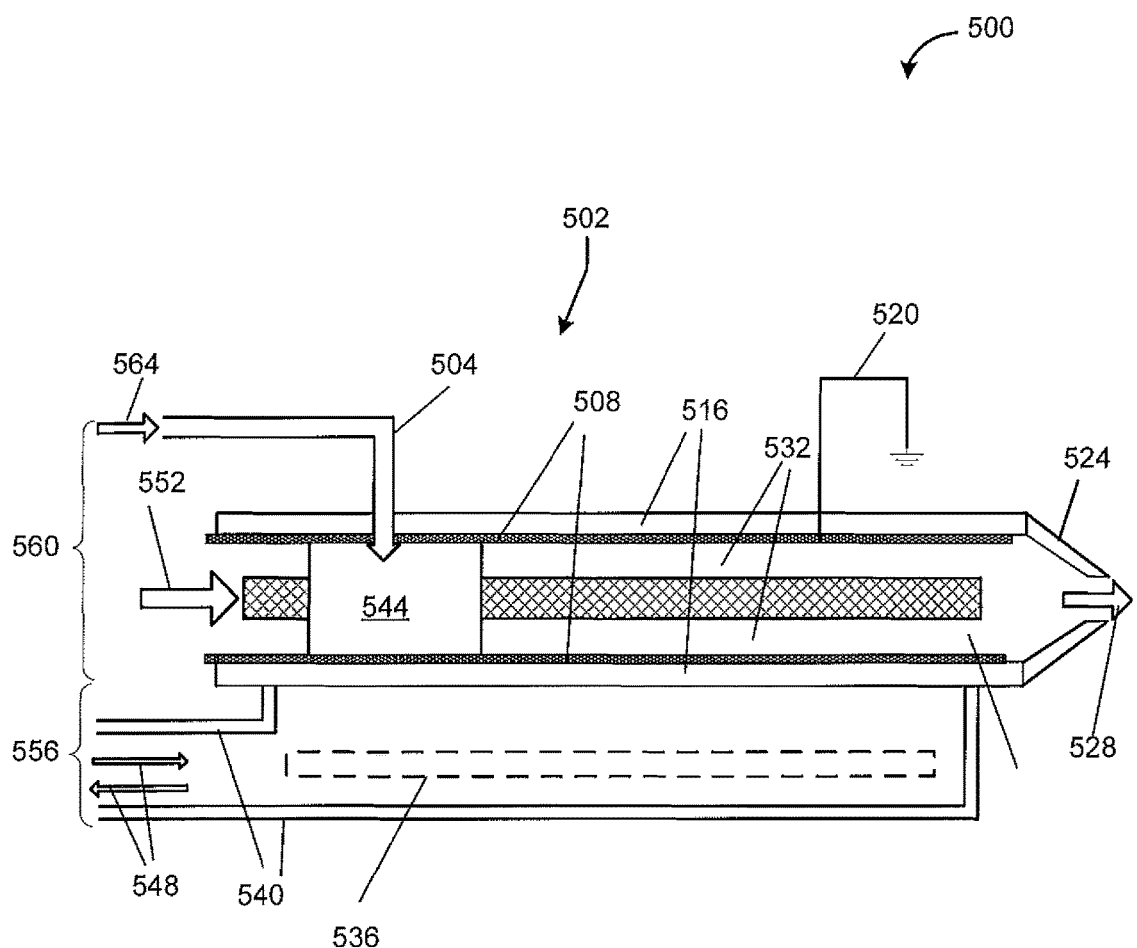

FIG. 5 is an exemplary architectural diagram of an exemplary atomic oxygen generator as discussed in J Y Jeong, et al., "Etching materials with an atmospheric-pressure plasma jet", Plasma Sources Science Technology 7, (1998) pp 282-285, IOP Publishing Limited.

Figure 6:
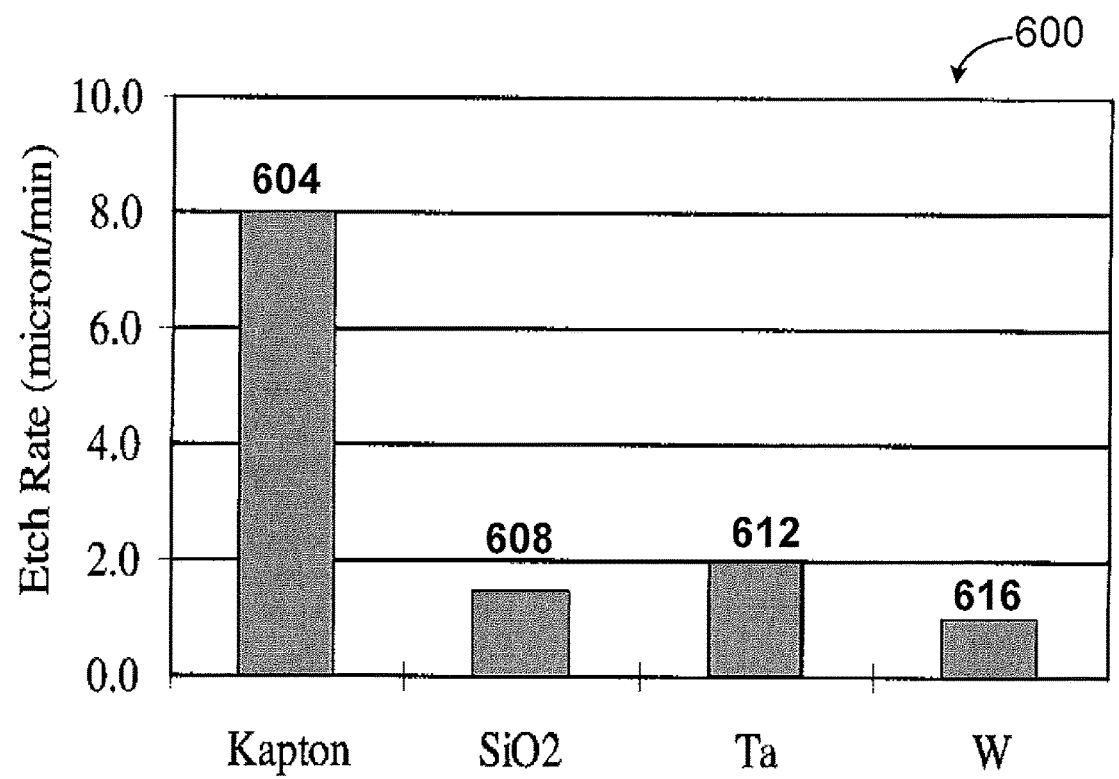

FIG. 6 is an exemplary graph of the etch rate for Kapton®, SiO2, Ta, and W using a plasma jet, as discussed in J Y Jeong, et al., "Etching materials with an atmospheric-pressure plasma jet", Plasma Sources Science Technology 7, (1998) pp 282-285, IOP Publishing Limited (Jeong).

Figure 7A:
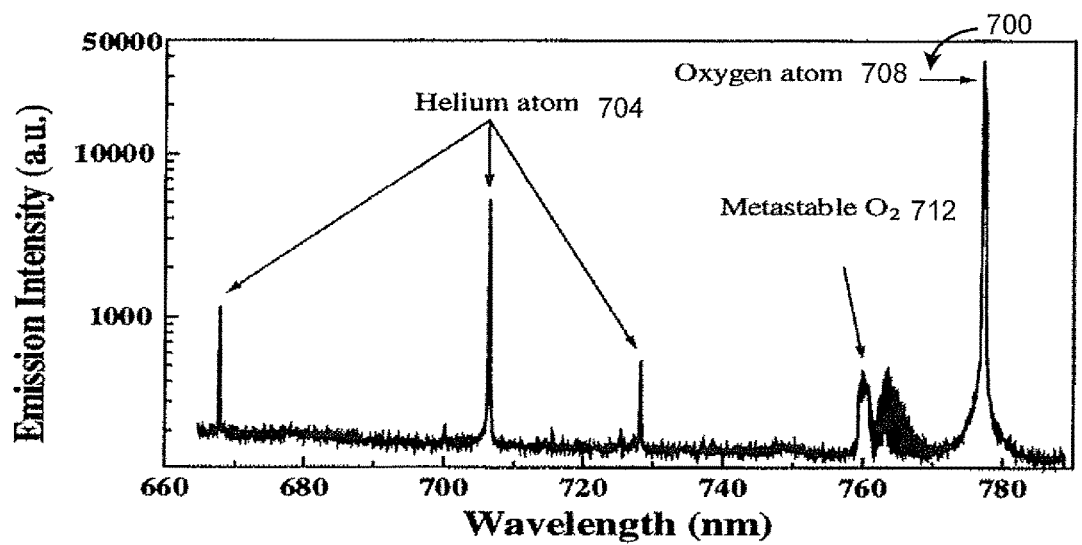
Figure 7B:
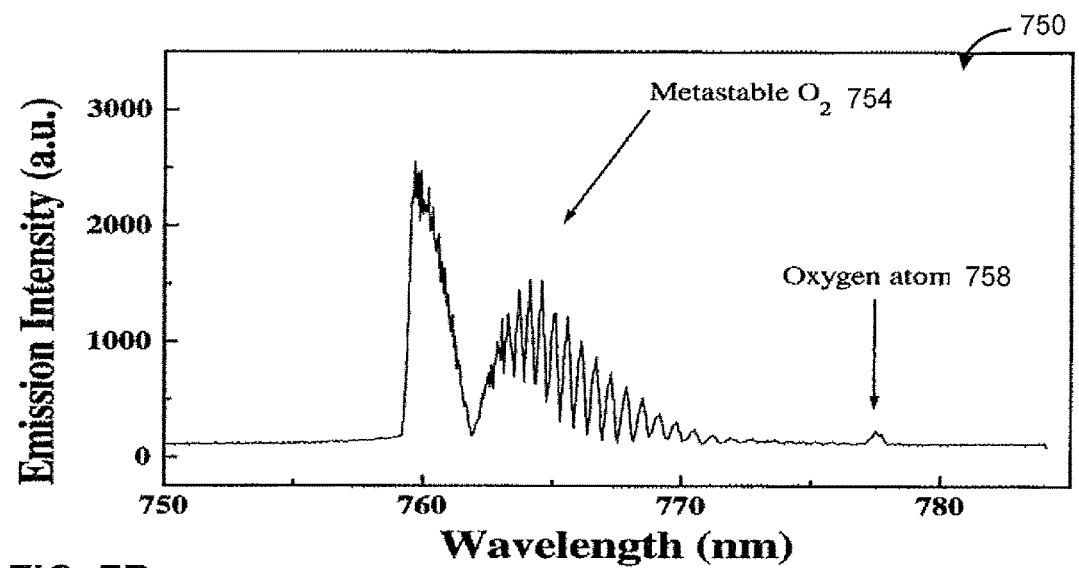

FIG. 7A is an exemplary graph of emission intensity spectra of helium atom, Oxygen atom, and metastable $O_2$ versus wavelength while FIG. 7B is an exemplary graph of emission intensity spectra of oxygen atom, and metastable $O_2$ versus wavelength, as discussed in J Y Jeong, et al., "Etching materials with an atmospheric-pressure plasma jet", Plasma Sources Science Technology 7 (1998) pp 282-285, IOP Publishing Limited.

Figure 8:
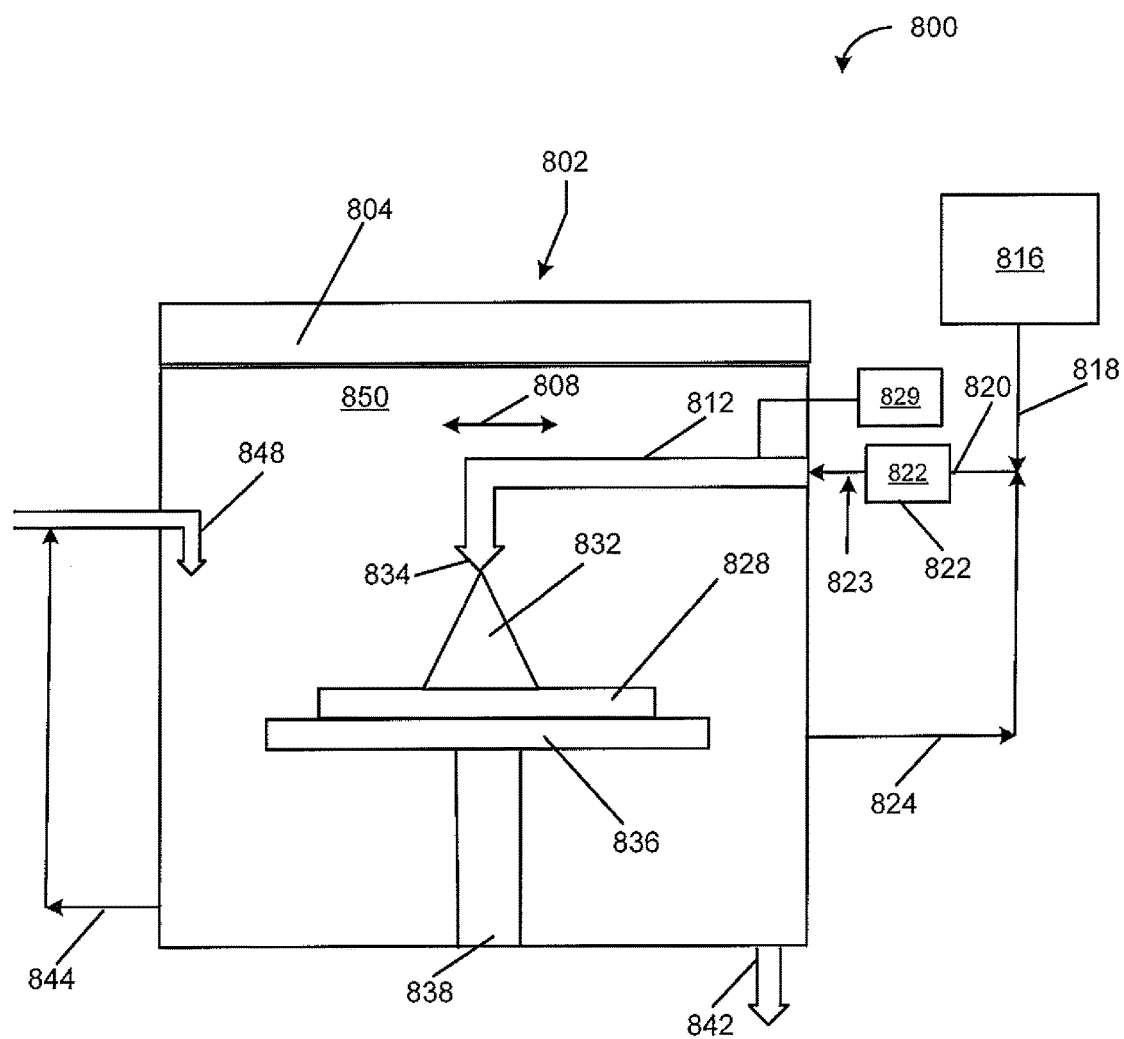

FIG. 8 is an exemplary diagram for a cleaning system using an atomic oxygen generator in another embodiment of the present invention.

Figure 9:
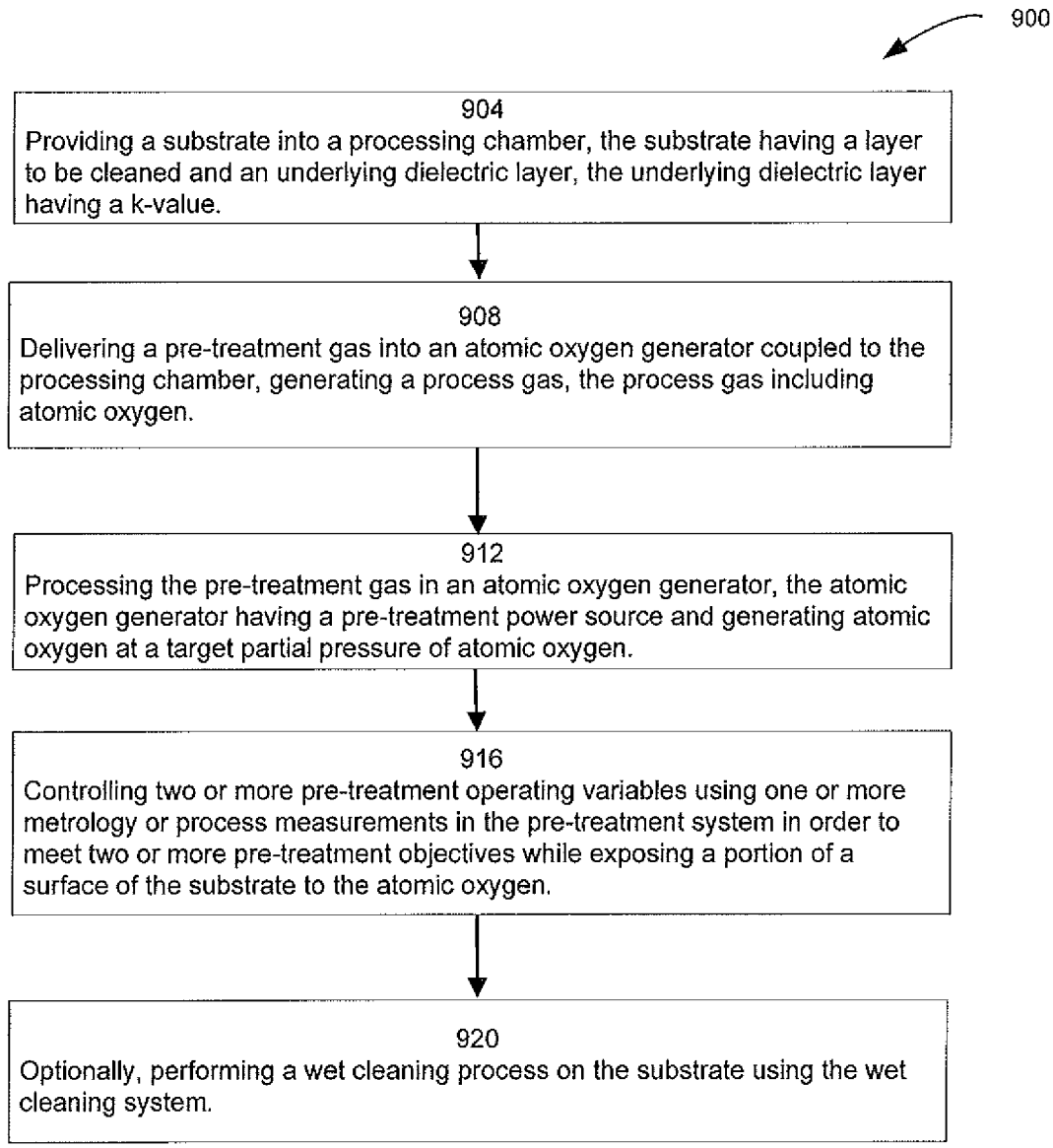

FIG. 9 is an exemplary flow chart for a method of cleaning a substrate comprising a pre-treatment process and a wet cleaning process in an embodiment of the present invention.

Figure 10:
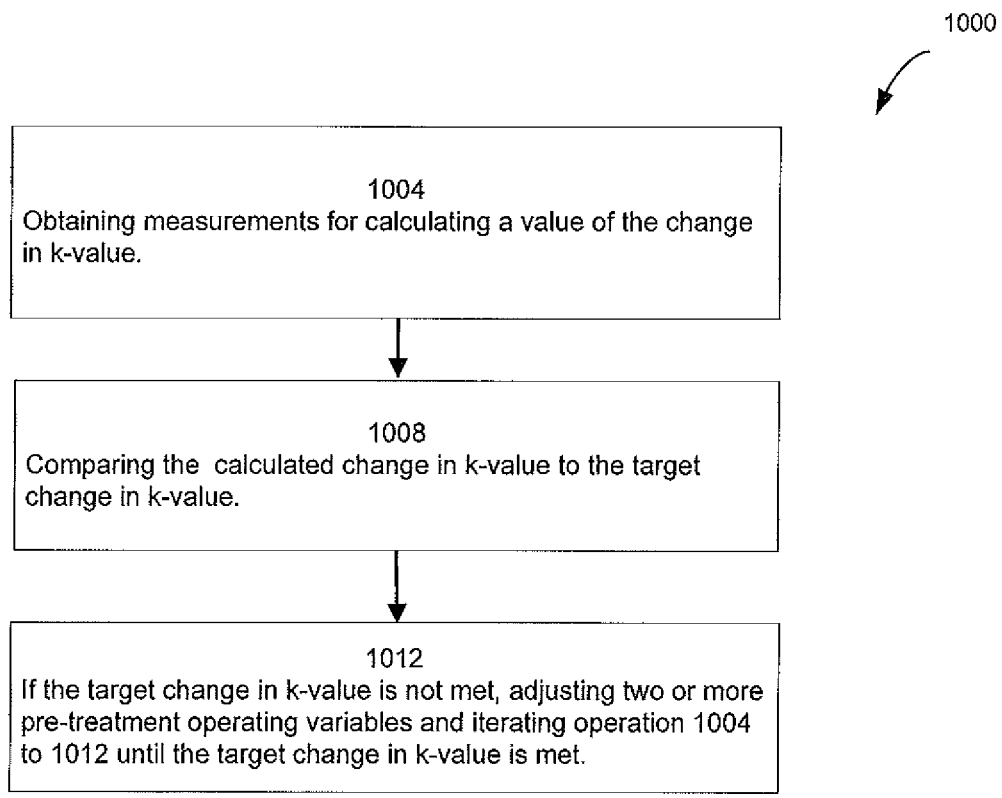

FIG. 10 is an exemplary flow chart of a method of controlling a cleaning system using selected cleaning operating variables in an embodiment of the present invention.

Figure 11:
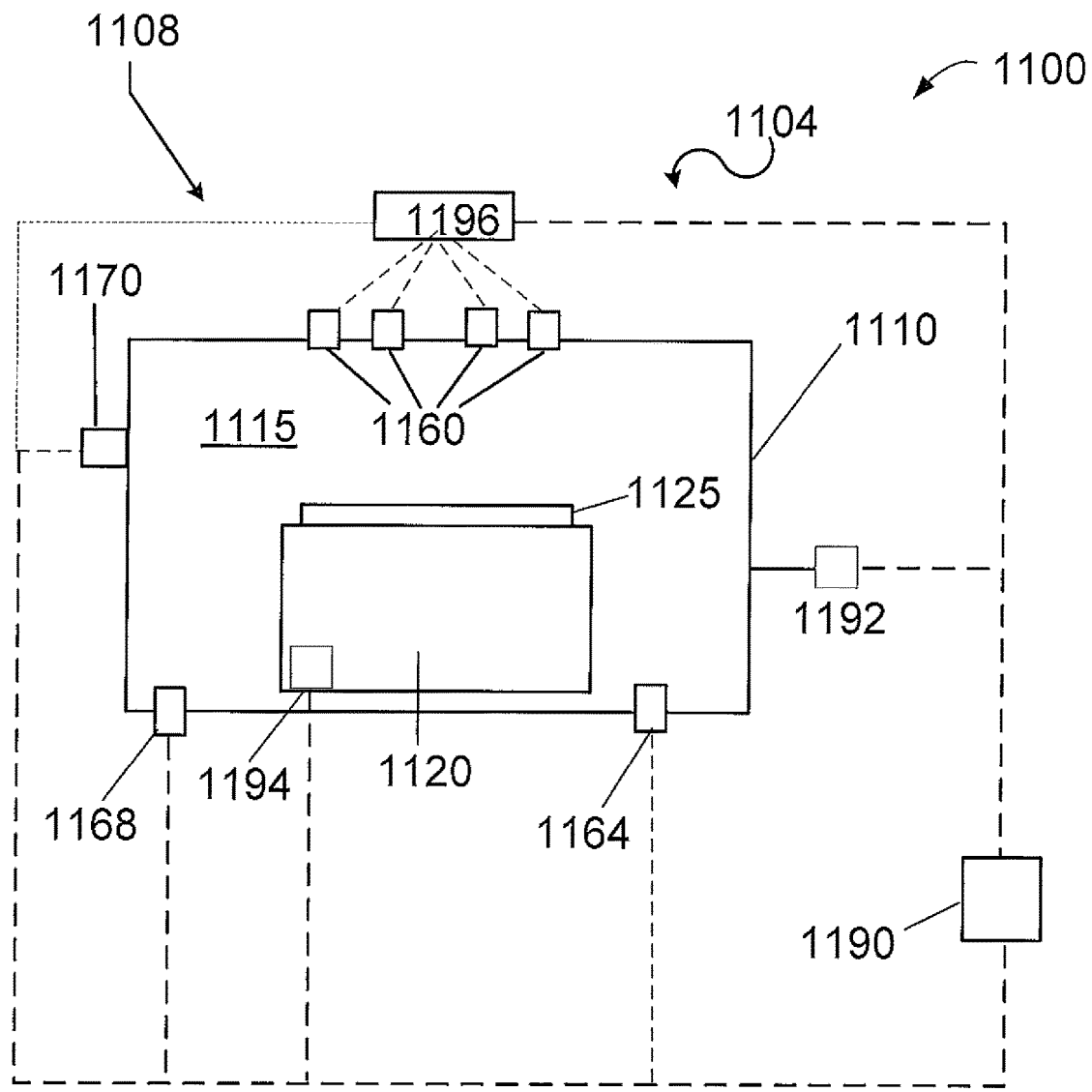

FIG. 11 is an exemplary architectural diagram of a cleaning system depicting use of a controller for optimizing the operating variables of the cleaning system to meet cleaning objectives.

DETAILED DESCRIPTION OF EXEMPLARY EMBODIMENTS

Figure 1A:
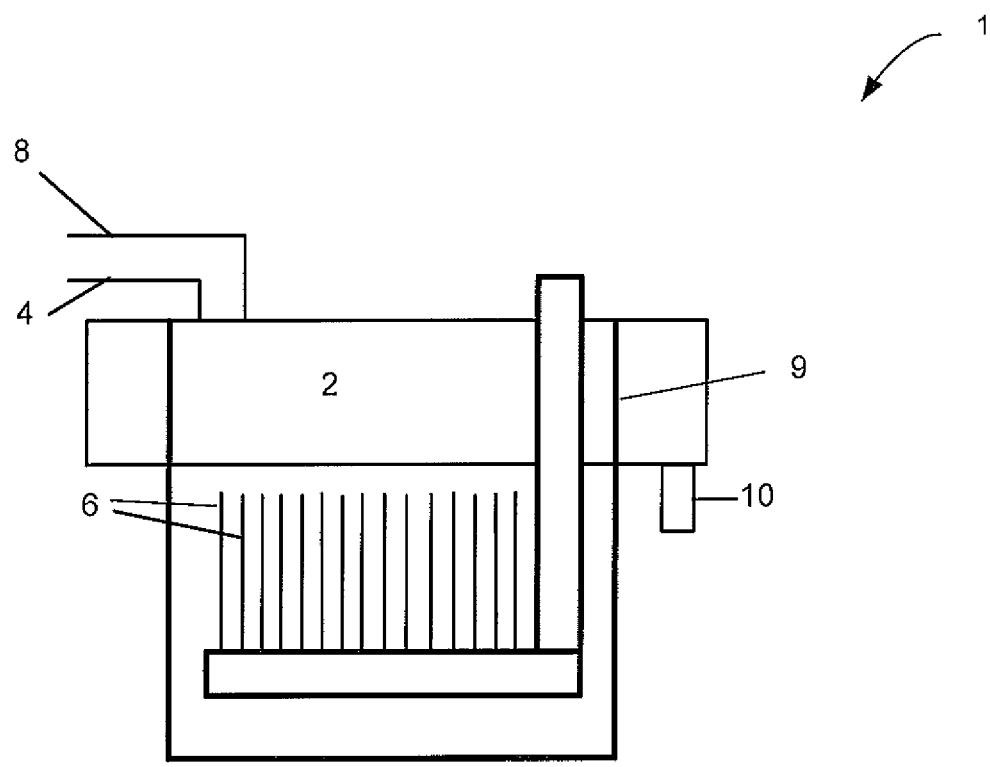
FIG. 1A is an architectural diagram illustrating a prior art method of resist cleaning in a batch etch process.

FIG. 1A is an architectural diagram illustrating a prior art method of resist cleaning in a batch etch process. In order to facilitate the description of the present invention, a semiconductor substrate is utilized to illustrate applications of the concept. The methods and processes equally apply to other workpieces such as a wafer, disk, memory or the like. Similarly, aqueous sulfuric acid and hydrogen peroxide mixture may be utilized to illustrate a treatment liquid in the present invention. As mentioned below, other treatment liquids can alternatively be used. The treatment liquid can include primary, secondary, and tertiary chemicals, one or more process gases, and reaction products. The term atomic oxygen is used to represent oxygen radicals including atomic oxygen, singlet sigma metastable oxygen molecules, and singlet delta metastable oxygen molecules, atomic oxygen plasma jet or combinations thereof.

Referring to FIG. 1A, an architectural diagram 1 illustrating a prior art method of surface treatment system such as resist cleaning in a batch etch process, where the etch chemicals (etchants) are dispensed using one or more input streams, 4 and 8, onto the etch processing chamber 9 where a plurality of substrates 6 are positioned. The etchants may be reused or recycled or disposed of using the overflow tank 2 and overflow spout 11. Heaters (not shown) can be provided, for example, by having heaters on the sides or at the bottom of the etch processing chamber 9. The heaters may be external or inline.

Figure 1B:
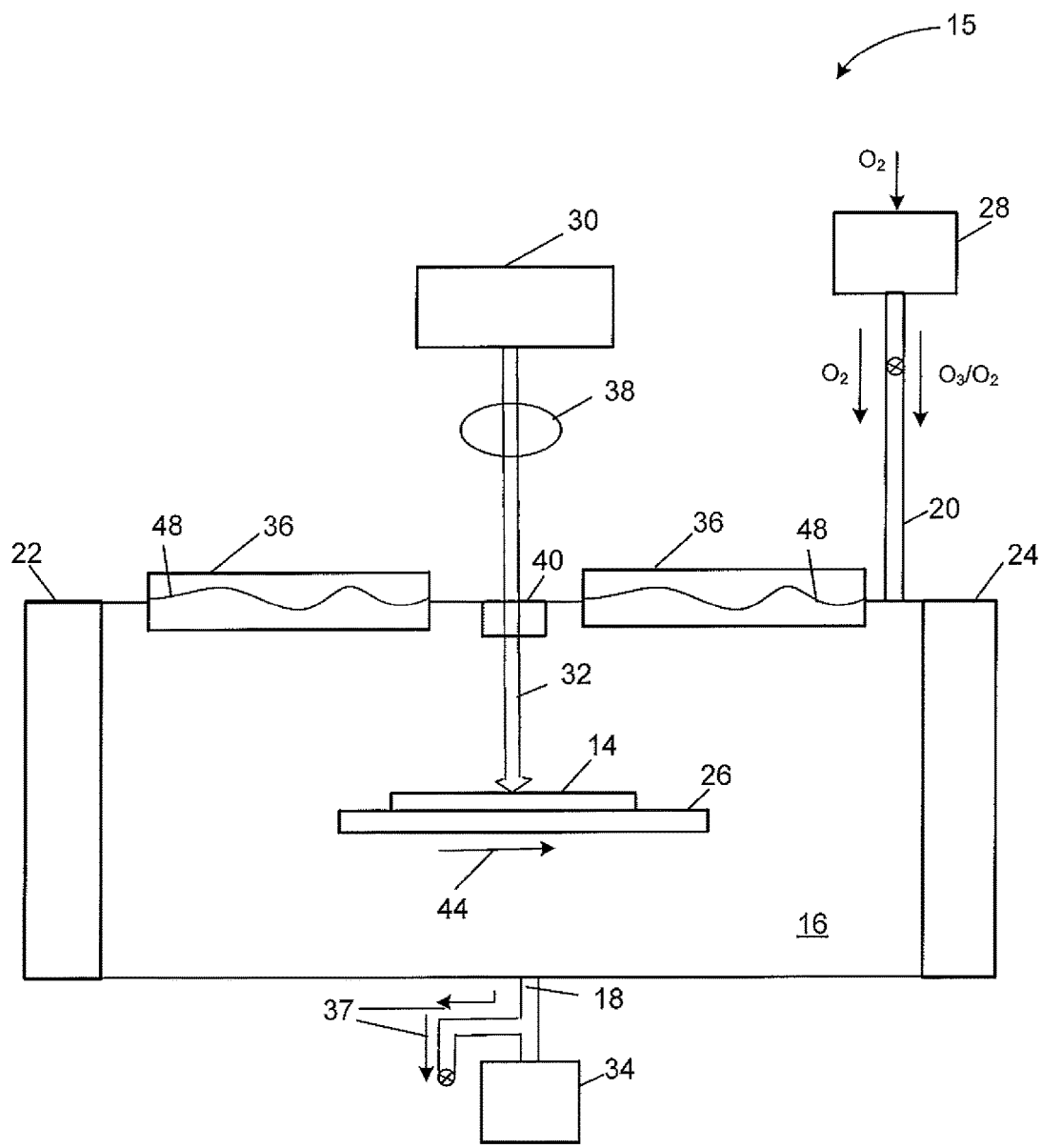
FIG. 1B is a diagram of a prior art apparatus for removing photoresist (resist) from a substrate using two or more passes of a UV laser beam in a reaction chamber.

FIG. 1B is a diagram of a prior art apparatus for removing photoresist (resist) from a substrate 14 using two or more passes of a UV laser beam 32 in a reaction chamber 16. An apparatus 15 for cleaning a layer of organic material 14, such as a resist or polymer, is shown, including a reaction chamber 16, where a supply conduit 20 for process gases such as $O_2$ or $O_3$ and $O_2$ are being supplied. The $O_3$ can be generated from $O_2$ input into in situ $O_3$ generator 28 or generated with the laser beam 32. The reaction chamber 16 has the means for generating $O_3$ using UV lamps 36 through quartz windows 48. The laser source 30 directs the laser beam 32 through a focusing lens 38 and a transparent window 40. The substrate 14 containing the layer to be cleaned is loaded by a substrate loader 22, moved past the laser 32 by conveyor 26 in the direction of movement 44 and unloaded by substrate unloader 24. The method of cleaning is done by moving the substrate 14 two or more times past the UV laser beam 32 until the substrate 14 is cleaned. Exhaust process gas is continuously pumped through the exhaust conduit 18 by the exhaust pump 34 as indicated by the exhaust arrows 37.

FIG. 1C is an architectural diagram 100 illustrating a prior art system of cleaning using a UV source with two major wavelength ranges. The cleaning system 102 where the UV source 104 is located above a diffusion plate 124, the diffusion plate 124 configured to block 185 nm wavelength light to irradiate the substrate 132 during the pre-treatment process and protect the UV source 104 and associated equipment during the subsequent wet cleaning process. The process gas 112 can comprise oxygen and/or nitrogen. Alternatively, the process gas can comprise oxygen and/or nitrogen and/or ozone. In addition, fan filter unit 120, air is introduced into the process chamber 116 during the pre-treatment process. During the wet cleaning process, the treatment liquid 140 is delivered into the process chamber 116 by delivery device 136 onto the substrate 132, where the treatment liquid 140 and process gases 112 are continuously removed through exhaust units, 144 and 128. As mentioned above, due to the use of UV light, the substrate can be damaged or the k-value affected to make the substrate unusable.

Figure 2:
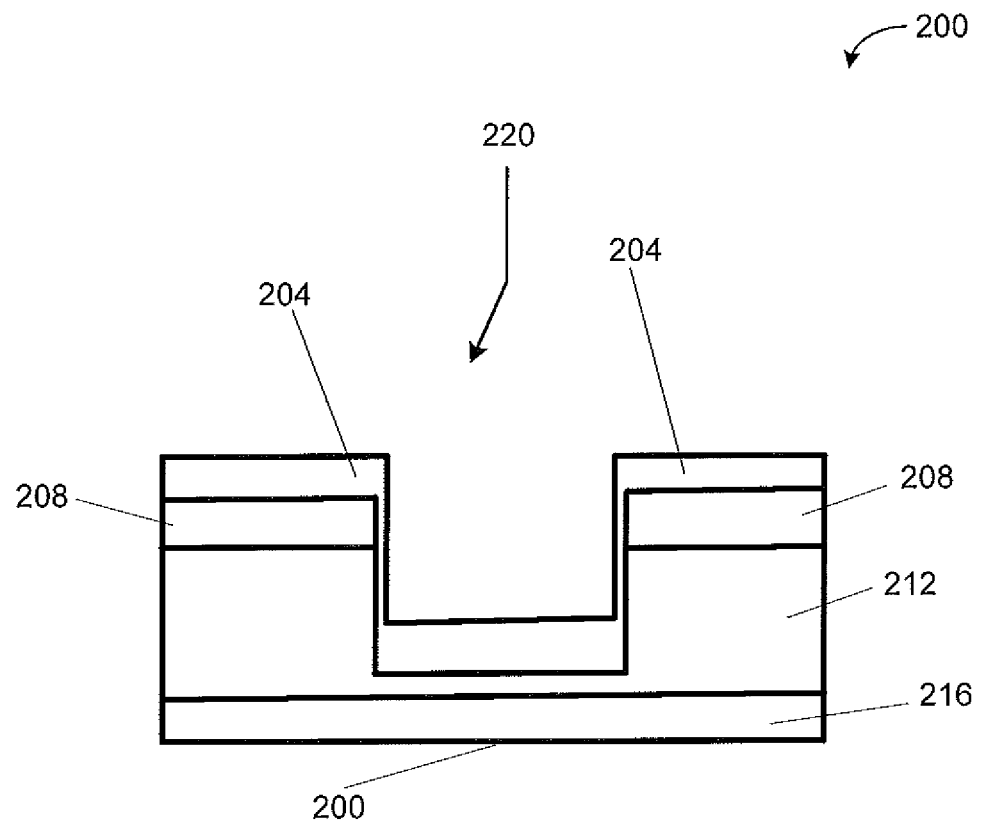
FIG. 2 is an exemplary side-view diagram of a polymer film and resist for low-k samples used in a pre-treatment process and a wet cleaning process.

FIG. 2 is an exemplary diagram 200 of layers of a low-k sample used in cleaning a substrate 220 using a pre-treatment process with a process gas followed by a wet cleaning process. The substrate 220 comprises a silicon layer 216, an advanced low k (ALK) dielectric film 212, where the k-value is in the range from 2.0 to 2.2. Above the ALK dielectric film 212 is photoresist 208. The top conformal layer is polymer film 204 in the range of 60 to 70 nm. The cleaning of the substrate includes removal of the polymer film 204 and the photoresist 208 by the combined pre-treatment process and the wet etch process.

FIG. 3A depicts an exemplary side-view image 300 of a substrate before the exposure of the substrate to the process gas. The side-view image 300 of a repeating structure, for example, in a post-etch process and prior to the two-step cleaning method comprising a pre-treatment process and a subsequent wet clean process. The repeating structure 304 is characterized by the width 308 and a height 312. FIG. 3B depicts an exemplary side-view image 330 of the substrate after the pre-treatment exposure to atomic oxygen. Cleaning of the substrate layer starts as evidenced by the smaller width 338 and a higher height 342. FIG. 3C is an exemplary side-view image 360 of the substrate after the pre-treatment process and the subsequent wet clean process are complete. Cleaning of the post etch substrate is substantially complete and the target critical dimensions, such as the target width 372 and the target height 368, are achieved.

FIG. 4 is an exemplary diagram 400 for a cleaning system using an atomic oxygen generator in an embodiment of the present invention. Feed process gas delivery system 416 is supplied to the processing chamber 402 where the feed process gas 418 can include a mixture of $O_2$ and $N_2$, a mixture of $O_2$ and helium, or clean dry air (CDA). In some embodiments, fan filtered unit (FFU) air can be used as a feed process gas 416. The substrate 428 can be placed on a substrate spinner 436 coupled to a motion control system 438. The processing chamber can also include a clean dry air (CDA) or nitrogen gas distribution plenum for a wet process using the same processing chamber 402. Process gas 418 is delivered to the atomic oxygen generator 412 where atomic oxygen 432 is generated and delivered through a nozzle 434. The nozzle 434 can be scanned from center to edge or edge to center of the substrate as indicated in the direction of scan 408. The flow of atomic oxygen 432 exposes a portion of a surface of the substrate 428 and performs a pre-treatment process for the cleaning system.

Optionally, the atomic oxygen 432 can be recycled through recycle line 424. The wet clean process uses a wet clean delivery device 448 where the treatment liquid may include one or more of ammonium hydroxide ($NH_4OH$) and hydrogen peroxide ($H_2O_2$), dilute hydrogen fluoride (DHF), deionized water (DIW) and ozone ($O_3$), or dimethyl-sulfoxide (DMSO) or mono-ethylamine (MEA)), or other wet cleaning chemistries that are well known in the art, such as chemistries available from ATMI, EKC, MGC, Fuji Film, Advantor, JT Baker, or APCI. The treatment liquid can optionally be recycled using recycle line 444. In an embodiment, the flow of atomic oxygen 432 needs to reach the surface of the substrate 428 in time before substantial conversion of the atomic oxygen back to molecular oxygen occurs. This timing consideration requires the nozzle 434 to be positioned close to the substrates' 428 surface, for example, 2 to 4 mm above the substrate 428 surface. In another embodiment, where a vacuum system (not shown) is attached to the processing chamber 450, for example, in a post etch cleaning application that utilizes a coupled vacuum system, the distance of the nozzle 434 to the substrate is not as critical. In these applications, a configuration of the atomic hydrogen generator such as the one in FIG. 5 can be used.

FIG. 5 is an exemplary architectural diagram 500 of an exemplary atomic oxygen processing system 502 as discussed in J Y Jeong, et al., "Etching materials with an atmospheric-pressure plasma jet", Plasma Sources Science Technology 7, (1998) pp 282-285, IOP Publishing Limited. An atmospheric-pressure atomic oxygen generator 560 comprises an inner electrode 532 which is coupled to a radio frequency power source 552 at about 13.6 Mhz and a grounded outer electrode 508 attached to a ground 520. The atomic oxygen generator 560 has a frame 516 that encloses the inner electrode 532 held in a quartz tube 544 and the outer electrode 508. The frame 516 has a nozzle tip 524 where the process gas 528 with the atomic oxygen comes out of the atomic oxygen generator 560.

Still referring to FIG. 5, a mixture of helium and other reactive gases, such as oxygen $O_2$, or carbon tetraflouride ($CF_4$), and the like, are delivered through the process gas line 504 into the annular space 532 between the two electrodes, the process gas at a first flowrate, a first temperature, and a first pressure. When an organic film such as a polymer is being cleaned, oxygen is added to the process gas 564. When silicon dioxide and metals are being cleaned, $CF_4$ is added in addition to $O_2$. The atomic oxygen generator 560 is coupled to a substrate processing device 556 that can be attached to the atomic oxygen generator 560. The substrate processing device 556 comprises a housing 540, where the substrate 536 is placed on a chuck (not shown) and a substrate loader and unloader 548. The substrate processing device 556 further can include heating or cooling devices (not shown), optical metrology devices, and process sensors (also not shown) that are subject to the prevailing atmospheric pressure. Other configurations of the substrate processing device 556 can be used, for example, the configuration in FIG. 4. Alternative methods of producing atomic oxygen include techniques and configurations described in:

U.S. Pat. No. 4,828,817 METHOD FOR PRODUCING AN ATOMIC OXYGEN BEAM, by Outlaw, R A., issued on Jul. 20, 1994.

U.S. Pat. No. 5,332,551 ATOMIC OXYGEN REACTOR HAVING AT LEAST ONE SIDEARM CONDUIT, by Koontz, S L, issued on Jul. 26, 1994.

U.S. Pat. No. 4,649,273 VARIABLE ENERGY HIGH FLUX GROUND-STATE ATOMIC OXYGEN REACTOR, by Chutjian, O J, et al., issued on Mar. 11, 1987.

In addition, atomic oxygen generators are available commercially from: (1) Omicron Nano Technology USA, LLC, 1435 Larimer St., Suite 140, Denver, Colo. 80202; (2) tetra GmbH, D-60323 Frankfurt, Reuterweg 65, Germany; and (3) DR. EBERL MBE-KOMPONENTEN GMBH, Josef-Beyerle-Str. 18/1 D-71263 Weil der Stadt, Germany.

FIG. 6 is an exemplary graph 600 of the etch rate for Kapton®, SiO2, Ta, and W using an atomic oxygen plasma jet, as discussed in J Y Jeong, et al., "Etching materials with an atmospheric-pressure plasma jet", Plasma Sources Science Technology 7, (1998) pp 282-285, IOP Publishing Limited (Jeong). Cleaning rates were reported in Jeong where a window of stable operation was achieved at helium flow rates greater than 25 l/min, $O_2$ concentrations of up to 3% of volume, carbon tetrafluoride ($CF_4$) concentration of up to 3% of volume, and radio frequency (RF) power between 50 and 500 W. Rates of etching for Kapton® was 8.0 μm/min for Kapton® 604, 1.2 μm/min for silicon dioxide 608, 2.0 μm/min for tantalum 612, and 1.0 μm/min for tungsten 616. As mentioned above, the cleaning was performed in the prevailing atmospheric pressure.

FIG. 7A is an exemplary graph 700 of emission intensity spectra of helium atom, oxygen atom, and metastable $O_2$ versus wavelength while FIG. 7B is an exemplary graph 750 of emission intensity spectra of oxygen atom, and metastable $O_2$ versus wavelength, as discussed in J Y Jeong, et al., "Etching materials with an atmospheric-pressure plasma jet" Plasma Sources Science Technology 7 (1998) pp 282-285, IOP Publishing Limited. FIG. 7A is a graph 700 of an emission spectrum of the discharge (528 FIG. 5) between the two electrodes (508 and 532 FIG. 5). Metastable $O_2$ is an excited state oxygen that has a longer lifetime than the ordinary excited states and generally has a shorter lifetime than the ground state of oxygen. The emission spectrum is measured along the flow direction and shows 3 He atom lines 704, a singlet metastable O2 line 712, and an atomic oxygen line 708. FIG. 7B is a graph 750 of the emission intensity as function of wavelength that is taken perpendicular to the flow direction. A distinguishable band from 757 to 773 nm which is caused by the transition from singlet sigma metastable oxygen to ground state oxygen. Another small band at about 778 nm is consistent with oxygen atom emissions. In the absence of excitation, the atoms and ions have de-excitation of about 11 ns and relax to ground state immediately upon exciting the nozzle (524, FIG. 5). The singlet sigma metastable oxygen molecules have a longer lifetime of about 110 ns. It is known in the art that singlet metastable oxygen molecules, including both the sigma and the delta version, are capable of oxidizing organic compounds such as polymers.

The inventor noted from tests that without the pre-treatment UV process, the wet clean process alone does not consistently clean the polymer completely. The pre-treatment process using UV light has proved to widen the process window of the cleaning chemistry to remove challenging post etch polymer. As the residues at the back-end-of line include more fluorinated residue, it is more difficult to remove this residue with wet chemistry alone. Several technical trends increase the potential value of the pre-treatment. First, due to the lower k-value of film with increased porosity and changes in film deposition and cure, the use of the pre-treatment irradiation or exposure of the substrate to radicals makes the film more sensitive to the subsequent cleaning chemistry. Specifically for reactive ion etching (RIE), the process development due to ultra-low k (ULK) materials and scaling of organic residue leads to post etch polymer composition changes that require expensive and time consuming reformulation of the post etch clean chemistry. This time consuming reformulation can be avoided using the two step method described in this application. The inventor found that the pre-treatment process using atomic oxygen and process gases can completely perform the cleaning of the substrate layer. In this invention, the percentage of cleaning with the pre-treatment process can intentionally be set to less than 100 percent in order to minimize the change in the k-value of the substrate and keep the k-value change inside of the acceptable range for the substrate application. The goal is not to completely remove the polymer layer but to chemically modify the post etch polymer to make it easier to remove with a wet cleaning process and eliminate damage to the underlying dielectric.

FIG. 8 is an exemplary diagram 800 for a cleaning system using an atomic oxygen generator 812 in an embodiment of the present invention. Feed process gas delivery system 816 is supplied to the processing chamber 802 where the feed process gas 818 can include a mixture of $O_2$ and $N_2$, a mixture of $O_2$ and helium or other inert gas, or clean dry air (CDA). In an embodiment, fan filtered unit (FFU) air can be used as a feed process gas 816. The substrate 828 can be placed on a substrate spinner 836 coupled to a motion control system 838. The processing chamber 802 can also include a distribution plenum 804 for distributing CDA or nitrogen gas into the process space 850. Process gas 818 passes through a temperature adjustment device 822, (heater or cooler), where additional inert gas 823 can be introduced in order to maintain a range of oxygen partial pressure, and goes into an atomic oxygen generator 812 where atomic oxygen 832 is generated and delivered through a nozzle 834. The nozzle 834 can be scanned from center to edge or edge to center of the substrate as indicated in the direction of scan 832. The atomic oxygen generator 812 can be powered by atomic oxygen power source 829 where the atomic oxygen power source 829 can provide radio frequency (RF), electric, or microwave energy. In another embodiment, the pre-treatment process can be performed in a vacuum chamber where vacuum pump 842 is used to bring the pressure in the process space 850 to about 10 mTorr. Use of a vacuum chamber can minimize the recombination of the atomic oxygen into regular molecular form, O2.

The flow of atomic oxygen 832 exposes a portion of a surface of the substrate 828 and performs a pre-treatment process for the substrate cleaning system. Optionally, the atomic oxygen 832 can be recycled through recycle line 824. In an embodiment, as mentioned above, the percentage of cleaning with the pre-treatment process can intentionally be set to less than 100 percent in order to minimize the change in the k-value of the substrate and keep the k-value change inside of the acceptable range for the substrate application. When a wet clean process is needed to complete the cleaning, the wet clean process can use a wet clean delivery device 848 where the treatment liquid may include one or more of ammonium hydroxide ($NH_4OH$) and hydrogen peroxide ($H_2O_2$), dilute hydrogen fluoride (DHF), deionized water (DIW) and ozone ($O_3$), or dimethyl-sulfoxide (DMSO) or mono-ethylamine (MEA)), or other wet cleaning chemistries that are well known in the art, such as chemistries available from ATMI, EKC, MGC, Fuji Film, Advantor, JT Baker, or APCI. The treatment liquid can optionally be recycled using recycle line 844. As shown in FIG. 8, the wet cleaning process can use the same processing chamber 802 after the pre-treatment process. Alternatively, the substrate can be processed in a different processing chamber. In another embodiment, the percentage of cleaning with the pre-treatment process can intentionally be set to the target cleaning percentage, substantially close to 100 percent while controlling the change in the k-value of the substrate to stay within the selected range. Complete removal of the post etch polymer with the pre-treatment process adds a benefit of reducing pattern collapse, a risk that come with drying the substrate after the wet cleaning.

FIG. 9 is an exemplary flow chart 900 for a method of cleaning a substrate using a pre-treatment process and a wet cleaning process of a cleaning system in an embodiment of the present invention. In operation 904, a substrate with a layer to be cleaned and an underlying dielectric layer where the underlying dielectric has a k-value is placed in a processing chamber of the cleaning system. In operation 908, a pre-treatment gas is delivered into an atomic oxygen generator coupled to the processing chamber, the atomic oxygen generator generating atomic oxygen radicals, referred to generally as atomic oxygen, in the process gas flow. The atomic oxygen generator can be powered using an RF, microwave or electric power source. In operations 912, the pre-treatment gas is processed in the atomic oxygen generator, the atomic oxygen generator having a pre-treatment power source and generating atomic oxygen at a target partial pressure of atomic oxygen.

The pre-treatment cleaning percentage can be in the range of 50 to 99%, the pre-treatment process time can be 120 seconds or less, and the change in k-value can be 0.2 or less. In one embodiment, the cleaning percentage can be 100%. The atomic oxygen pre-treatment will focus on 20-100% cleaning as a function of film thickness change while the wet cleaning step will focus on the remaining balance up to 100%. The object is to modify the polymer residue to enable the wet cleaning process to completely remove the polymer residue. Two or more pre-treatment operating variables are selected and optimized towards achieving the two or more cleaning pre-treatment objectives. The two or more pre-treatment operating variables can include two of power of the atomic oxygen generator, substrate temperature, pre-treatment cleaning percentage, atomic oxygen partial pressure, input oxygen partial pressure, pre-treatment process time, total process time, or the like. The power of the atomic oxygen generator can be in a range from 50 to 500 W, the oxygen partial pressure can be from 15 to 159 Torr, the substrate temperature can be from 25 to 150° C., and the k-value of the underlying dielectric can be from 2.0 to 2.6. In one embodiment, the pre-treatment cleaning percentage can be 100%, i.e., the pre-treatment is used to perform the complete cleaning of the polymer in the substrate. The two or more cleaning objectives can include two of target pre-treatment cleaning percentage that is less than 100%, a target change in k-value of underlying dielectric layer in pre-treatment, a target pre-treatment process time, a target total process time or the like.

In operation 916 the selected two or more pre-treatment variables are controlled using selected one or more metrology measurements in the pre-treatment system in order to meet the two or more pre-treatment objectives. In operation 920, an optional wet cleaning process is performed on the substrate using the wet cleaning system. The wet cleaning is optional if the pre-treatment process is set to completely clean the substrate. The wet cleaning system can use a variety of chemistries including sulfuric acid and hydrogen peroxide (SPM), SPM with ozone (SPOM), phosphoric acid and steam, ammonium hydroxide and hydrogen peroxide, dilute hydrofluoric acid (DHF), deionized water and ozone, dimethyl sulfoxide and monoethanol amine (DMSO/MEA), or other wet cleaning chemistries that are well known in the art, such as chemistries available from ATMI, EKC, MGC, Fuji Film, Advantor, JT Baker, or APCI.

FIG. 10 is an exemplary flow chart 1000 of a method of controlling a cleaning system using selected cleaning operating variables in an embodiment of the present invention. In operation 1004, measurements for calculating a value of the two or more pre-treatment objectives are obtained. The measurements can include obtaining the top view images of the substrates during the pre-treatment process to check the cleaning progress, check the percentage of layer removal, check the elapsed pre-treatment time, check the composition of the process gas, pre-treatment power, or the rotation speed of substrate. In operation 1008, the calculated values of the two or more pre-treatment objectives are compared with the set two or more pre-treatment objectives. Calculation of the values of the two or more pre-treatment objectives can include calculating the change in k-value, the percentage of cleaning in the pre-treatment process, or the cost of ownership based on projected unit throughput of substrates. In operation 1012, if the two or more cleaning objectives are not met, the two or more selected operating variables are adjusted until the two or more pre-treatment cleaning objectives are met. For example, the pre-treatment power can be adjusted to increase or decrease the percentage of cleaning in the pre-treatment process. The substrate temperature, the flow rate of oxygen and other gases, or partial pressure of the oxygen and/or other gases may be adjusted to increase the oxygen radical or atomic oxygen partial pressure in the process gas. The pre-treatment process time may be shortened to minimize change of k-value or lengthened to ensure higher percentage of cleaning.

FIG. 11 is an exemplary architectural diagram 1100 of a cleaning system 1104 depicting use of a controller 1190 for optimizing the operating variables of the cleaning system 1104 towards meeting the two or more cleaning objectives. The cleaning system 1104 can use two or more optical metrology devices 1108. An optical emission spectroscopy (OES) device 1170 can be coupled to the processing chamber 1110 at a position to measure the optical emission from the processing region 1115. In addition, another set of optical metrology devices 1160 can be disposed atop the processing chamber 1110. Although four optical metrology devices are shown, many other alternative and different configurations of the optical metrology devices can be positioned to implement design objectives using a plurality of optical metrology devices. The four optical metrology devices can be spectroscopic reflectometric devices and/or interferometric devices. The measurements from the two or more optical metrology devices, for example, the OES device 1170 and the set of optical metrology devices 1160, are transmitted to the metrology processor (not shown) where one or more critical dimension values are extracted. The measurement system 1108 can use one or more optical metrology devices 1170 and/or 1160 and one or more etch sensor devices 1164 and 1168.

As mentioned above, a process sensor device, for example, can be a residue sensor device 1164 measuring the percentage of residue remaining, or measuring a cleaning operating variable with a substantial correlation to percentage of residue removal. Another process sensor device can include a device measuring the partial pressure of atomic oxygen or the total pressure of the process gases. Selection of at least one or more process sensor devices can be done using multivariate analysis using sets of process data, metrology data (diffraction signals) and process performance data to identify these inter-relationships. The measurements from the two or more optical metrology devices, for example, the OES device 1170 and the set of optical metrology devices 1160 and the measurement from the sensor device 1164 and/or 1168 are transmitted to the metrology processor (not shown) where the operating variable values are extracted.

Still referring to FIG. 11, the cleaning system 1104 can include a controller 1190 coupled to sub-controllers in the two or more optical metrology measurement devices 1109 comprising a plurality of optical metrology devices 1160, optical emission spectroscopy (OES) device 1170, and one or more etch sensor devices, 1164 and 1168. One or more chemical monitors 1192 can be coupled to the processing chamber to ensure the process gases are within the ranges set. Another sub-controller 1194 can be included in the motion control system 1120 that is coupled to the controller 1190 and can adjust the first and second speed of the rotation of the motion control system for a single substrate tool. The controller 1190 can be connected to an intranet or via the Internet to other controllers in order to optimize the cleaning operating variables and in order to achieve the two or more cleaning system objectives.

Although only certain embodiments of this invention have been described in detail above, those skilled in the art will readily appreciate that many modifications are possible in the embodiments without materially departing from the novel teachings and advantages of this invention. For example, although one exemplary process flow is provided for cleaning of substrates, other process flows are contemplated. As also mentioned above, the cleaning method and system of the present invention can be used in an FEOL or BEOL fabrication cluster. Accordingly, all such modifications are intended to be included within the scope of this invention.

What is claimed:

1. A method for cleaning a substrate in a single substrate cleaning system, the cleaning system comprising a pre-treatment system used in pre-treatment process and a wet cleaning system used in a wet cleaning process, the pre-treatment system including a processing chamber and a gas delivery sub-system, the method comprising:
    providing a substrate having a layer to be cleaned and an underlying dielectric layer, the underlying dielectric layer having a k-value;
    delivering a pre-treatment gas into the processing chamber using the gas delivery sub-system, the pre-treatment gas comprising oxygen at a partial pressure and an oxygen temperature;
    processing the pre-treatment gas in an atomic oxygen generator, the atomic oxygen generator powered using an RF, microwave, or electric power source and generating atomic oxygen at a target partial pressure of atomic oxygen;
    exposing a portion of a surface of the substrate to the atomic oxygen;
    obtaining one or more metrology measurements in the pre-treatment system during the exposing;
    controlling two or more cleaning operating variables during the exposing using the one or more metrology measurements obtained in the cleaning system during the exposing in order to meet two or more cleaning objectives; and
    optionally performing a wet cleaning process using the wet cleaning system;
    wherein the two or more cleaning operating variables comprise substrate temperature, an atomic oxygen partial pressure, atomic oxygen temperature, atomic oxygen flow rate, a pre-treatment gas total pressure, and/or pre-treatment process time; and
    wherein the two or more cleaning objectives comprise at least two cleaning objectives selected from a target pre-treatment cleaning percentage that is less than or equal to 100%, a target change in k-value of the underlying dielectric layer in pre-treatment, or a target pre-treatment process time.

2. The method of claim 1:
    wherein the two or more cleaning objectives further include at least a third cleaning objective of a target total cost of ownership for both the pre-treatment system and the wet cleaning system.

3. The method of claim 1 wherein the target pre-treatment cleaning percentage is in a range from 50 to 99 percent.

4. The method of claim 1 wherein the target pre-treatment process time is 70 to 80 seconds.

5. The method of claim 1 wherein the two or more cleaning objectives include a target total cost of ownership for the combined pre-treatment system and the wet cleaning system, the target pre-treatment process time, and the target change in k-value.

6. The method of claim 5 wherein:
the target total cost of ownership for the combined pre-treatment system and wet cleaning system is less than the cost of cleaning the substrate using the wet cleaning system only;
the target pre-treatment process time is less than 120 seconds; and
the target change in k-value of the underlying dielectric layer is 0.2 or less.

7. The method of claim 1 wherein the pre-treatment gas utilizes a mixture of oxygen and nitrogen or a mixture of oxygen and helium or a mixture of oxygen and argon, or clean dry air (CDA).

8. The method of claim 1 wherein the atomic oxygen generating device includes a nozzle positioned 2 to 4 mm from the surface of the substrate to deliver the atomic oxygen to the surface of the substrate before the atomic oxygen substantially converts to molecular oxygen.

9. The method of claim 1 wherein the atomic oxygen generating device comprises an atmospheric pressure plasma jet device, the atmospheric pressure plasma jet device comprising an outer grounded electrode and center electrode coupled to a radio frequency power source.

10. The method of claim 1 wherein the k-value of the dielectric layer is less than 2.6 and/or wherein the substrate temperature is controlled to be in a range from 25 to 300 degrees C.

11. The method of claim 1 wherein the atomic oxygen partial pressure is controlled to be in a range of 15 to 159 torr and the total pre-treatment gas pressure is controlled to be in a range from 80 to 760 torr.

12. The method of claim 1 further comprising:
after completion of the pre-treatment processing, the optional wet cleaning process using the wet cleaning system is performed.

13. The method of claim 12:
wherein the pre-treatment process is performed using single wafer system and the wet cleaning process is performed using a single wafer system; or
wherein the pre-treatment process and the wet cleaning process are performed in the same processing chamber.

14. The method of claim 13 wherein the wet cleaning process is performed using a treatment liquid that comprises two or more of ammonium hydroxide ($NH_4OH$), hydrogen peroxide ($H_2O_2$), hydrogen fluoride (DHF), deionized water (DIW), ozone ($O_3$), dimethyl-sulfoxide (DMSO), monoethylamine (MEA) or tetramethylammonium hydroxide (TMAH).

15. The method of claim 1 wherein the cleaning system is part of a post-etch residue removal process.

16. The method of claim 1 wherein the cleaning system further comprises a vacuum system configured to enable flow of atomic oxygen to a portion of a surface of the substrate to meet the two or more cleaning objectives.

17. The method of claim 1 wherein the processing chamber is a combined processing chamber configured to function during the pre-treatment process and function during the subsequent wet cleaning process.

18. The method of claim 1, wherein the two or more cleaning operating variables are controlled to meet the two or more cleaning objectives including the target pre-treatment cleaning percentage at a value of less than 100percent removal of the layer to be cleaned and a change of k-value of the underlying dielectric of 0.2 or less.

19. A method for cleaning a substrate in a single substrate cleaning system, the cleaning system comprising a pre-treatment system used in pre-treatment process and a wet cleaning system used in a wet cleaning process, the pre-treatment system including a processing chamber and a gas delivery sub-system, the method comprising:
providing a substrate having a layer to be cleaned and an underlying dielectric layer, the underlying dielectric layer having a k-value;
selecting a set of pre-treatment objectives including a cleaning percentage of less than 100 percent removal of the layer to be cleaned and a change of k-value of the underlying dielectric of 0.2 or less;
delivering a pre-treatment gas into the processing chamber using the gas delivery sub-system, the pre-treatment gas comprising oxygen at a partial pressure and an oxygen temperature;
processing the pre-treatment gas in an atomic oxygen generator, the atomic oxygen generator powered using an RF, microwave, or electric power source and generating atomic oxygen at a target partial pressure of atomic oxygen;
exposing a portion of a surface of the substrate to the atomic oxygen;
obtaining one or more metrology measurements in the pre-treatment system during the exposing; and
controlling two or more cleaning operating variables during the exposing based on the one or more metrology measurements obtained in the cleaning system during the exposing to achieve the selected set of pre-treatment objectives,
wherein the two or more cleaning operating variables comprise substrate temperature, an atomic oxygen partial pressure, atomic oxygen temperature, atomic oxygen flow rate, a pre-treatment gas total pressure, and/or pre-treatment process time.

20. The method of claim 19 further comprising:
performing a wet clean process using the wet clean system, after completion of the pre-treatment process, wherein the set of pre-treatment objectives further includes a target total cost of ownership for the combined pre-treatment system and the wet cleaning system that is less than the cost of cleaning the substrate using the wet cleaning system only.

* * * * *